United States Patent
Moreaux et al.

(10) Patent No.: US 7,400,874 B2
(45) Date of Patent: Jul. 15, 2008

(54) INTEGRATED CIRCUIT COMPRISING A CLOCK-SIGNAL GENERATOR, SMART CARD COMPRISING AN INTEGRATED CIRCUIT OF THIS KIND AND ASSOCIATED METHOD FOR THE GENERATION OF CLOCK SIGNALS

(75) Inventors: Christophe Moreaux, Eguilles (FR); Ahmed Kari, Aix (FR); Olivier Tardieu, Marseilles (FR)

(73) Assignee: STMicroelectronics SA, Paris (FR)

(*) Notice: Subject to any disclaimer, the term of this patent is extended or adjusted under 35 U.S.C. 154(b) by 348 days.

(21) Appl. No.: 10/498,681

(22) PCT Filed: Dec. 11, 2002

(86) PCT No.: PCT/FR02/04280

§ 371 (c)(1),
(2), (4) Date: Jun. 10, 2004

(87) PCT Pub. No.: WO03/050955

PCT Pub. Date: Jun. 19, 2003

(65) Prior Publication Data

US 2005/0133603 A1      Jun. 23, 2005

(30) Foreign Application Priority Data

Dec. 13, 2001   (FR) .................................... 01 16066

(51) Int. Cl.
*H04B 1/16* (2006.01)

(52) U.S. Cl. ...................... 455/334; 455/41.2; 455/558; 340/572.7; 340/825.71

(58) Field of Classification Search ................ 455/41.1, 455/41.2, 334, 558; 331/110; 340/572.7, 340/825.71, 825.72, 825.77
See application file for complete search history.

(56) References Cited

U.S. PATENT DOCUMENTS

| | | | |
|---|---|---|---|
| 5,332,936 A | 7/1994 | Nakao | |
| 6,003,777 A | 12/1999 | Kowalski | |
| 6,097,292 A * | 8/2000 | Kelly et al. | ............... 340/572.7 |
| 6,501,259 B1 * | 12/2002 | Cheng | ..................... 324/76.53 |
| 6,525,410 B1 | 2/2003 | Gelsomini et al. | |
| 6,907,234 B2 * | 6/2005 | Karr et al. | ................. 455/193.1 |
| 2001/0008296 A1 * | 7/2001 | Gelsomini et al. | .......... 257/500 |

FOREIGN PATENT DOCUMENTS

EP        0 687 119 A1     12/1995

* cited by examiner

*Primary Examiner*—Nay Maung
*Assistant Examiner*—Tuan H. Nguyen
(74) *Attorney, Agent, or Firm*—Hogan & Hartson LLP

(57) ABSTRACT

A contactless integrated circuit receiving an RF signal comprises a clock-signal generator to produce a clock signal from a first half wave and a second half wave representing the received RF signal. Also disclosed is a method for the generation of a clock signal in which the first half wave and the second half wave are compared to produce the clock signal. The invention is adapated for use in contactless cards, transponders, and the like.

15 Claims, 2 Drawing Sheets

INTEGRATED CIRCUIT COMPRISING A CLOCK-SIGNAL GENERATOR, SMART CARD COMPRISING AN INTEGRATED CIRCUIT OF THIS KIND AND ASSOCIATED METHOD FOR THE GENERATION OF CLOCK SIGNALS

BACKGROUND OF THE INVENTION

1. Field of the Invention

The invention relates to an integrated circuit comprising a clock-signal generator and an associated clock-signal generating method. The invention is particularly valuable for integrated circuits used in contactless applications, such as smart cards, transponders etc.

In contactless circuits, the data and the energy received by the chip are transmitted by a reader (or sender) in the form of an amplitude-modulated radiofrequency signal or RF signal. The term "modulation" is the one most frequently used when referring to communications from the reader to the contactless circuit. As a complement, the contactless circuit may send digital data to the reader. In this case, the term used is "reverse modulation".

2. Description of the Prior Art

One integrated circuit known for contactless applications comprises especially (FIG. 1) an antenna 11, a rectifier bridge 12, a voltage regulator 13, a logic circuit 14, a clock-signal generator 15 and the modulation/demodulation circuit 16.

The RF signal is received by the antenna 11 which produces two signals AC0 (shown in FIG. 2), AC1 having the form of two positive half waves, the RF signal being approximately equal to the result of the subtraction of the signal AC1 from the signal AC0.

The rectifier bridge 12 is a four-diode bridge. It has two inputs connected to two inputs/outputs of the antenna 11 to receive the two signals AC0, AC1, and one output at which a rectified voltage HVR is received. The voltage HVR is approximately the sum of two signals AC0, AC1; the mean amplitude of the rectified voltage varies directly as a function of the distance between the reader and the contactless integrated circuit. The mean amplitude of the rectified voltage may thus vary from approximately 2 V when the circuit is at some tens of centimeters from the reader to about 15-20 V when the circuit is at some millimeters from the reader. In practice, the voltage HVR is most usually limited to about 8 V by an appropriate device.

The voltage regulator 13 receives the rectified voltage HVR and produces a power supply voltage VDD having a nominal stable and continuous value VDD0 of about 3 V (for a 0.6 μm technology). This voltage will be used thereafter for the power supply of all the components of the integrated circuit. The regulator 13 comprises, inter alia, a filter comprising especially a set of resistors and capacitors associated according to known schemes.

The voltage VDD varies as follows. At the beginning of the reception of the RF signal sent out by the reader, during the transitional phase, the voltage VDD varies rapidly between a zero value and a nominal value VDD0. The voltage VDD then keeps its nominal value VDD0 until the interruption of the reception of the RF signal, either because the circuit stops sending or because the contactless circuit becomes located at far too great a distance from the antenna. In other words, after the transitional phase, the voltage VDD keeps the nominal value only if the energy received by the circuit by means of the RF signal is sufficient.

The modulation and demodulation circuit 16 may extract digital data, contained in the received RF signal, from the rectified voltage HVR. This digital data will be exploited by other components of the integrated circuit. For the reverse modulation (communication from the contactless circuit to the reader) the circuit 16 may also modulate data to be transmitted to the reader on the RF signal received and the RF signal modulated by the circuit 16 is then re-transmitted by means of the antenna 11.

The clock-signal generator 15 produces a clock signal CLK from the half-wave AC0 signal. The clock signal CLK is then used to set the rate of the operation of all the components of the integrated circuit.

Finally, the logic circuit 14 receives the power supply voltage VDD and produces different control signals when the power supply voltage VDD reaches a minimum value close to its nominal value VDD0. The control signals are, for example, the signals POR, CLKDIS, used to activate the circuit and of the clock-signal generator 15.

The clock-signal generator 15 is made conventionally by means of a set of logic gates. According to one embodiment, the clock-signal generator comprises a NOR type two-input logic gate to which there are respectively applied the signal AC0 and the control signal CLKDIS, and an output at which the clock signal CLK is produced.

The signal CLK varies in normal operation according to the timing diagram of FIG. 2. When the signal CLKDIS, herein equal to "0", is active, the signal CLK is equal to "0" if the amplitude of the signal AC0 is greater than a threshold voltage VTRIG, and the signal CLK is equal to "1" if the amplitude of the signal AC0 is lower than the threshold voltage VTRIG. When the signal CLKDIS is inactive (in practice for a few microseconds after the start of reception of the RF signal), the signal CLK is equal to zero.

The threshold voltage VTRIG corresponds to a tripping threshold voltage of the logic converters used to make the NOR gate. The voltage VTRIG depends especially on the threshold voltage of the transistors constituting the inverters and especially the voltage VDD that powers them.

As can clearly be seen in FIG. 2, the signal CLK obtained has a cyclical ratio different from ½. This may raise difficulties of operation for certain components of the contactless circuit.

Another drawback of known clock-signal generators is that they are liable to work badly if the power supply voltage VDD undergoes major changes. This is for example the case when a reverse modulation starts.

Indeed, to transmit data to the reader, the circuit 16 modulates the RF signal with the data to be transmitted. The modulated signal is then re-transmitted to the reader by means of the antenna 11, as seen here above.

In practice, the RF signal is modulated by varying the load perceived by the antenna 11. This can be done by varying the load at output of the rectifier bridge 12, or again by drawing one and/or the other of the potentials AC0, AC1 to the ground.

This leads to a substantial and immediate drop in the amplitude of the AC0, AC1 as soon as the reverse modulation starts (the instant T0 in the timing diagram of FIG. 3). The reduction of the amplitude of the signal AC0 will lead to a reduction of the voltage VDD. The variations in voltage VDD are nevertheless far slower than those of the amplitude of the signal AC0; this is due essentially to the presence of filters in the voltage regulator 13. The voltage VDD will thus drop slightly during a few periods of the signal AC0, until it reaches a new value VDD1 that is far lower than VDD0. It will then keep this new value VDD1 throughout the duration of the reverse modulation. In the example of FIG. 3, three periods are needed for the voltage VDD to reach its stable value VDD1. In practice, about ten periods may be necessary.

The voltage VTRIG, which depends directly on the voltage VDD and conditions the generation of the clock signal CLK, will follow the variations of the voltage VDD (see FIG. 3). At the instant T1, the voltage VTRIG is still far higher than the amplitude of the signal AC0, so that the logic gates of the clock-signal generator do not trip: the signal CLK does not vary at the instant T1 whereas it should have varied. The same phenomenon recurs at the instant T2 of FIG. 3, inasmuch as the voltage VTRIG is still far too high as compared with the value of AC0. It is necessary to wait for a few half-wave periods AC0 to see a pulse appear on the signal (the instant T3 in the example of FIG. 3).

Thus, when the reverse modulation starts, the known clock-signal generators do not work accurately owing to the difference in behavior between the power supply voltage VDD and the amplitude of the half wave AC0.

This malfunction may have major consequences: in particular, it may give rise to errors of reception by the reader of the signal re-transmitted by the contactless circuit.

It is an object of the invention to make a new clock-signal generator that does not have such malfunctioning during major and rapid variations in the amplitude of the two half-waves AC0, AC1 on the antenna, for example when a reverse modulation is started.

It is another object of the invention to make a new clock-signal generator that produces perfectly even clock signals, with a cyclical ratio equal to ½.

SUMMARY OF THE INVENTION

With these goals in view, an object of the invention is a contactless integrated circuit receiving an RF signal, wherein the circuit comprises a clock-signal generator to produce a clock signal from a first half wave and a second half wave representing the RF signal received.

Thus, according to the invention, the clock signal is obtained from the two half waves AC0, AC1 and no longer from only one of them. In this way, the clock signal obtained is no longer dependent on the amplitude of either of these half waves because the amplitude of a half wave is no longer compared with a predefined threshold, unlike what is done in the prior art clock-signal generators.

According to a preferred mode of implementation of the invention, the clock signal is obtained by comparing the first half wave with the second half wave.

Thus, a comparison is made between two signals varying similarly in time (the amplitude and duration of the variations are similar) so that the comparison is not likely to be affected by error because of a difference in variation of the compared signals.

Furthermore, the clock signal obtained is perfectly symmetrical and has a cyclical ratio equal to ½, owing to the very shape of the two half waves, as shall be seen more clearly here below.

Preferably, the clock signal is produced after the power supply voltage VDD of the integrated circuit has become available, namely after the power supply voltage VDD has reached its nominal, continuous and regulated value. It is thus possible to supply the clock signal obtained and the power supply voltage simultaneously to any other component (memory, logic circuits etc.) of the integrated circuit using both the clock signal and the power supply voltage. Thus, any possible malfunctioning of a component of this kind is avoided.

According to a practical mode of implementation, the clock-signal generator according to the invention comprises a comparator of analog signals.

The invention finally relates to a smart card comprising an integrated circuit with a clock-signal generator as described here above, and to a method for producing clock-signal.

BRIEF DESCRIPTION OF THE DRAWINGS

The invention and the advantages that stem from it shall appear more clearly from the following description of exemplary embodiments of a clock-signal generator according to the invention. The description is made with reference to the appended drawings, of which.

DETAILED DESCRIPTION

The generator according to the invention is a comparator comprising (FIG. 4) two data inputs to which there are applied the signals AC0, AC1 produced at the antenna of a contactless integrated circuit and corresponding to the two half waves of the RF signals sent out by a reader.

Figure 5:
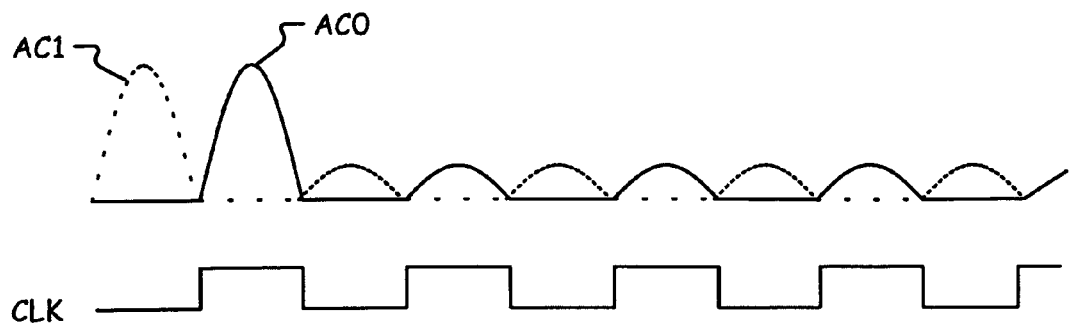
FIG. 5 is a timing diagram showing the progress of signals at different points of the circuit of FIG. 4.

The generator produces the clock signal CLK by comparing the signals AC0, AC1. If the amplitude of the signal AC0 is greater than that of the signal AC1 (FIG. 5), which in practice, owing to the very form of the signals AC0, AC1, means that the signal AC0 is positive and that the signal AC1 is zero, then the clock signal is active (equal to "1" in the example).

Conversely, if the signal AC0 is smaller than the signal AC1, in other words, if the signal AC0 is zero and the signal AC1 is positive, then the signal CLK is inactive (equal to "0" in the example).

The signal CLK obtained is perfectly symmetrical by the very shape of the half waves AC0, AC1 for:

AC0, AC1 have the same period and are similar: they are both zero on one half period and positive on the other half period, AC0, AC1 are separated in time by one half period.

Figure 1:
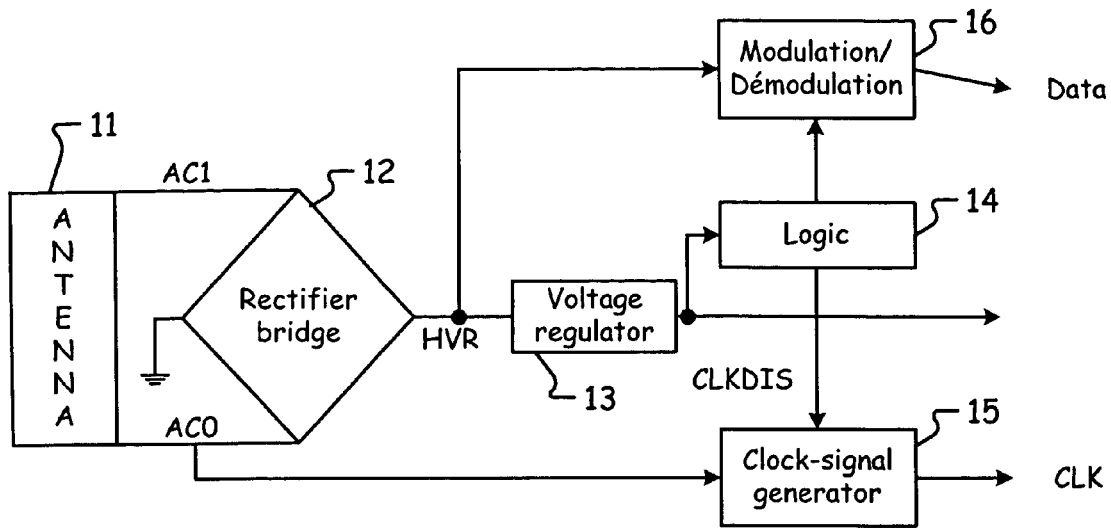
FIG. 1, which has already been described, is a block diagram of an integrated circuit for contactless applications.
Figure 2:
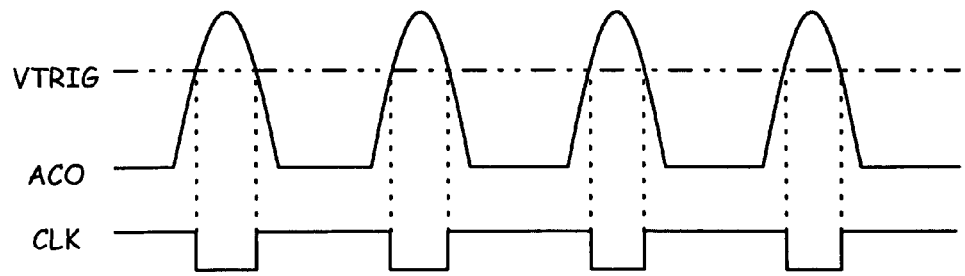
FIGS. 2, 3, which have already been described, are timing diagrams showing the changes undergone by the signals at different points of the circuit of FIG. 1.
Figure 3:
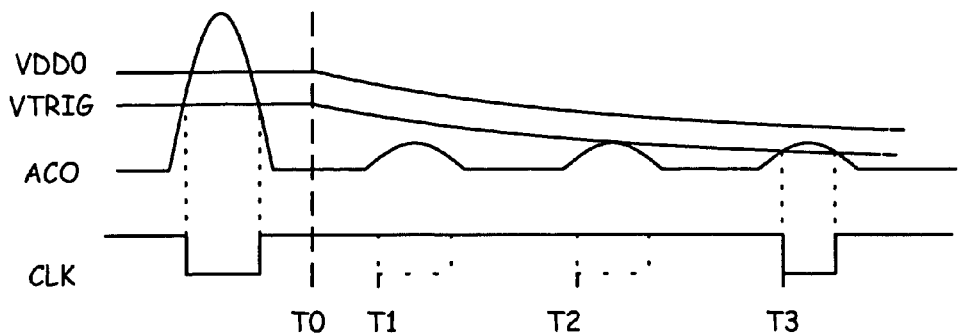
Figure 4:
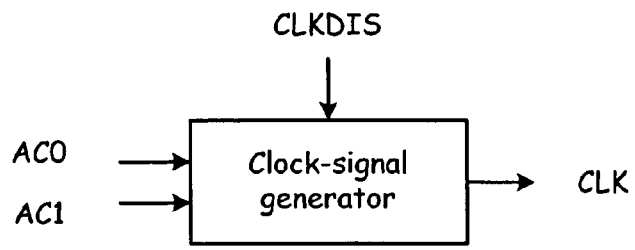
FIG. 4 is a drawing showing the principle of a clock-signal generator according to the invention.
Figure 6:
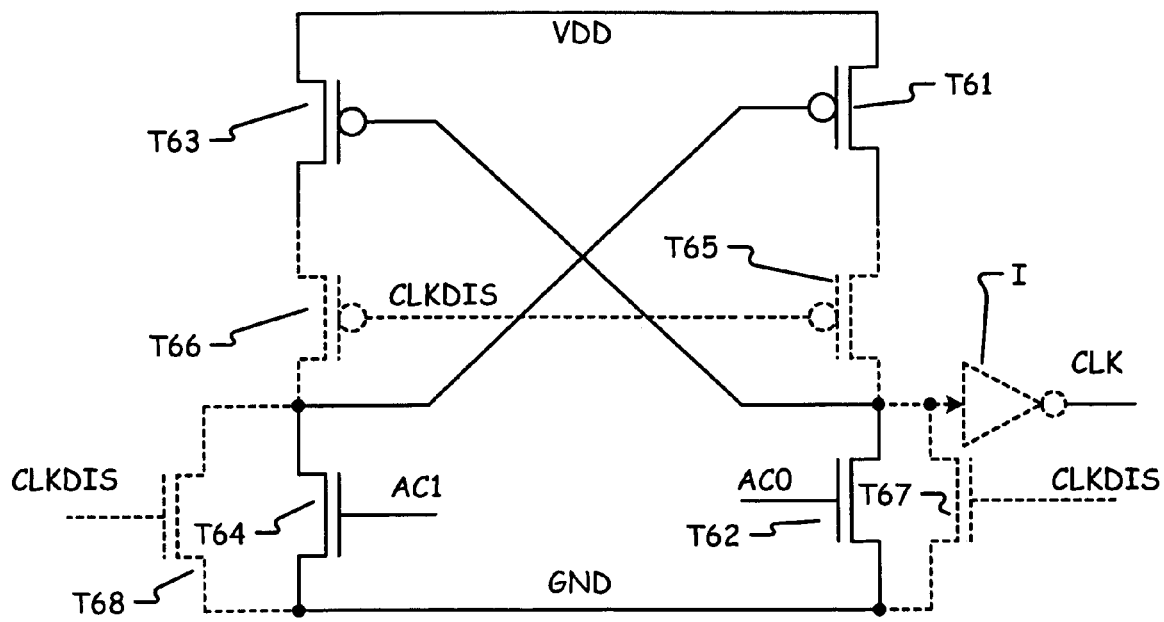
FIG. 6 is an electronic diagram of a possible embodiment of the circuit of FIG. 5.

The electronic diagram of FIG. 6 is a detailed view of a particular embodiment of the comparator of FIG. 4, comprising four P type transistors T61, T63, T65, T66, four N type transistors T62, T64, T67, T68 and one inverter.

The transistors T61, T65 and T62 are series-connected: a power supply voltage VDD is applied to the source of T61, the source of T65 is connected to the drain of T61, the drain of T62 is connected to the drain of T65 and the source of T62 is connected to a ground of the circuit.

The drain of T62 is also connected to an input of the inverter I, which produces the signal CLK.

The transistors T63, T66, T64 are also series-connected: the voltage VDD is applied to the source of T63, the source of T66 is connected to the drain of T63, the drain of T64 is connected to the drain of T66 and the source of T64 is connected to the ground of the circuit.

The gate of the transistor T61 is connected to the drain of T64 and the gate of T63 is connected to the drain of T62. Finally, the enabling signal CLKDIS is applied to the gates of the transistors T65, T66 connected together.

The signal CLKDIS is obtained in the same way as in the known contactless circuits. The signal CLKDIS is activated (in the example at "0") when the power supply voltage reaches a minimal value sufficient to provide for efficient operation of the integrated circuit and more specifically efficient operation of the clock-signal generator in the present case.

The working of the generator shall now be described in an example where it is assumed that, initially, the signal CLKDIS is active, the signal AC1 is equal to 0 and the signal AC0 is positive. The transistors T62, T63, T65, T66 are therefore on. The transistors T61, T64 are off and the signal CLK is equal to "1" (the instant T0 in FIG. 5).

At the instant T1, the signal AC1 passes to zero and the signal AC0 rises and becomes positive.

When the signal AC1 goes to zero, the transistor T64 goes off. Since the transistor T63 is still on, the charges conveyed by the current flowing across it collect at the drain of the transistor T64: the potential of the gate of the transistor T61 rises consequently and the transistor T61 gradually goes off.

At the same time, when the signal AC0 rises and becomes positive, the transistor T62 comes on. The current flowing across it leads the electrical charges present at its drain to the ground: the potential at the drain of the transistor T62 and at the gate of the transistor T63 falls accordingly and the transistor T63 gradually comes on. Furthermore, when the potential of the drain of the transistor T62 reaches the threshold value of the inverter I, the inverter trips and the signal CLK becomes equal to "1".

A new balance is set up when the potential at the drain of the transistor T64 reaches the value VDD and the potential at the drain of the transistor T62 reaches the zero value (ground of the circuit). It must be noted that, as compared with the duration of a half period of the AC0 (or AC1), the time needed for the tripping of the inverter I is almost zero.

Variants of the diagram of FIG. 6 may of course be envisaged.

For example, the role of the inverter I is to convert the potential at the drain of T62, which varies continuously, into a logic signal CLK taking two values 0 or 1 depending on whether or not the potential at the drain of T62 is greater than a potential threshold associated with the inverter I. The inverter I may be replaced by any component liable to fulfill this function, such as for example a logic gate or a converter.

The transistors T65, T66 have the function of authorizing or blocking the general working of the comparator, depending on the signal CLKDIS. They may be eliminated. As the case may be, the drains of the transistors T63, T64 are connected together and the drains of the transistors T61, T62 are connected together. In this case, a comparator working continuously is obtained: a comparator of this kind is less valuable in practice because, firstly, it consumes power continuously and, secondly, the supply of the clock signal before the power supply voltage VDD is available may lead to a possible malfunctioning of a component of the contactless circuit.

It is furthermore possible to add two transistors T67, T68 (represented in FIG. 6 by dashes) which herein are N type transistors. The drain and the source of T67 are respectively connected to the drain and the source of T62, and the drain and the source of T68 are respectively connected to the drain and the source of T64. Finally, the signal CLKDIS is applied to the gate of the transistors T67, T68. The addition of these two transistors makes it possible to connect all the nodes of the comparator to the ground when the signal CLKDIS is inactive (in the example equal to "1"). Thus, any untimely consumption of energy when there is no clock signal produced is prevented.

The invention of course is not limited to the embodiment of FIG. 6. In practice, the invention can be implemented by means of any comparison circuit used to compare two signals that vary similarly but in major proportions (since the amplitude of AC0, AC1 may vary between 2-3 V et 15-20 V).

What is claimed is:

1. A contactless integrated circuit receiving an RF signal, wherein the circuit comprises a clock-signal generator to produce a clock signal by the comparison of the amplitude of a first half wave to the amplitude of a second half wave representing the received RF signal.

2. An integrated circuit according to the claim 1, wherein the clock signal is produced after a supply voltage of the integrated circuit has become available, said supply voltage, stable and continuous, being produced by a voltage generator from the first half-wave and the second half-wave.

3. A contactless smart card, wherein the smart card includes an integrated circuit according to claim 2.

4. An integrated circuit according to claim 2, wherein the clock circuit comprises a comparator comprising:
a first transistor and a second transistor connected in series, the supply voltage being applied to a source of the first transistor and a ground voltage being applied to the source of the second transistor the first half wave being applied to a gate of the second transistor, the clock signal being produced at the drain of the second transistor,
a third transistor and a fourth transistor connected in series, the supply voltage being applied to a source of the third transistor and a ground voltage being applied to the source of the fourth transistor, the second half wave being applied to a gate of the fourth transistor, a gate of the first transistor being connected to the drain of the fourth transistor and a gate of the third transistor being connected to the drain of the second transistor.

5. An integrated circuit according to claim 1, wherein the clock circuit comprises a comparator comprising:
a first transistor and a second transistor connected in series, the supply voltage being applied to a source of the first transistor and a ground voltage (GND) being applied to the source of the second transistor, the first half wave being applied to a gate of the second transistor, the clock signal being produced at the drain of the second transistor,
a third transistor and a fourth transistor connected in series, the supply voltage being applied to a source of the third transistor and a ground voltage (GND) being applied to the source of the fourth transistor, the second half wave being applied to a gate of the fourth transistor, a gate of the first transistor being connected to the drain of the fourth transistor and a gate of the third transistor being connected to the drain of the second transistor.

6. An integrated circuit according to claim 5, further comprising:
a fifth transistor series-connected between the first transistor and the second transistor, a source and a drain of the fifth transistor being connected respectively to a drain of the first transistor and to the drain of the second transistor, and
a sixth transistor series-connected between the third transistor and the fourth transistor, a source and a drain of the sixth transistor being connected respectively to a drain of the third transistor and to the drain of the fourth transistor, an enabling signal being applied to a gate of the fifth transistor and to a gate of the sixth transistor connected together.

7. An integrated circuit according to claim 6, also comprising:
a seventh transistor comprising a drain and a source respectively connected to the drain and to the source of the second transistor, the enabling signal being applied to a gate of the of the seventh transistor.

8. A contactless smart card, wherein the smart card includes an integrated circuit according to claim 7.

9. An integrated circuit according to claim 7, also comprising:
an eighth transistor comprising a drain and a source respectively connected to the drain and to the source of the fourth transistor, the enabling signal being applied to a gate of the eighth transistor.

10. An integrated circuit according to claim 6, also comprising:
an eighth transistor comprising a drain and a source respectively connected to the drain and to the source of the fourth transistor, the enabling signal being applied to a gate of the eighth transistor.

11. A contactless smart card, wherein the smart card includes an integrated circuit according to claim 10.

12. A contactless smart card, wherein the smart card includes an integrated circuit according to claim 6.

13. A contactless smart card, wherein the smart card includes an integrated circuit according to claim 5.

14. A contactless smart card, wherein the smart card includes an integrated circuit according to claim 1.

15. A method for the production of a clock signal in a contactless integrated circuit wherein, during the method, a comparison is made between the amplitude of a first half wave and the amplitude of a second half wave representing an RF signal received by the integrated circuit, the clock signal being the result of the comparison.

* * * * *